United States Patent
Kim et al.

(10) Patent No.: US 7,116,953 B2
(45) Date of Patent: Oct. 3, 2006

(54) LOCAL OSCILLATOR USING I/Q MISMATCH COMPENSATING CIRCUIT THROUGH LO PATH RECEIVER USING THEREOF

(75) Inventors: Bon-Kee Kim, Yongin-si (KR); Bo-Eun Kim, Yongin-si (KR)

(73) Assignee: Integrant Technologies Inc., Kyeongki-do (KR)

( * ) Notice: Subject to any disclaimer, the term of this patent is extended or adjusted under 35 U.S.C. 154(b) by 454 days.

(21) Appl. No.: 10/697,988

(22) Filed: Oct. 31, 2003

(65) Prior Publication Data

US 2004/0092241 A1    May 13, 2004

(30) Foreign Application Priority Data

Oct. 31, 2002    (KR) ............ 10-2002-0066913

(51) Int. Cl.
*H03J 7/32*    (2006.01)
*H04B 1/10*    (2006.01)

(52) U.S. Cl. ............ 455/147; 455/208; 455/255

(58) Field of Classification Search ............ 455/130, 455/141, 147, 205, 208, 209, 226.1, 255, 455/236.1, 242.1, 264; 342/102, 103; 375/280, 375/327, 330, 331
See application file for complete search history.

(56) References Cited

U.S. PATENT DOCUMENTS

| | | | | |
|---|---|---|---|---|
| 4,394,626 A | * | 7/1983 | Kurihara et al. ............ 331/12 |
| 6,313,688 B1 | * | 11/2001 | Lee et al. ............ 327/359 |
| 6,670,900 B1 | * | 12/2003 | Zhang ............ 341/118 |
| 6,760,577 B1 | * | 7/2004 | Li ............ 455/323 |
| 6,892,060 B1 | * | 5/2005 | Zheng ............ 455/302 |
| 2002/0051091 A1 | * | 5/2002 | Dedieu et al. ............ 348/723 |
| 2002/0177425 A1 | * | 11/2002 | Li ............ 455/296 |
| 2003/0003891 A1 | * | 1/2003 | Kivekas et al. ............ 455/313 |
| 2003/0109241 A1 | * | 6/2003 | Kim ............ 455/324 |
| 2003/0206603 A1 | * | 11/2003 | Husted ............ 375/324 |
| 2004/0038649 A1 | * | 2/2004 | Lin et al. ............ 455/130 |
| 2004/0219884 A1 | * | 11/2004 | Mo et al. ............ 455/67.11 |
| 2005/0008107 A1 | * | 1/2005 | Brown ............ 375/343 |
| 2005/0041754 A1 | * | 2/2005 | Wu et al. ............ 375/295 |
| 2005/0047536 A1 | * | 3/2005 | Wu et al. ............ 375/346 |

* cited by examiner

*Primary Examiner*—Sonny Trinh
(74) *Attorney, Agent, or Firm*—Global IP Counselors, LLP (57) ABSTRACT

A local oscillator provides an in-phase local oscillating signal and quadrature-phase signal to first and second mixers outputting an input signal with a mixed in-phase local oscillating signal and quadrature-phase local oscillating signal, respectively. The oscillator comprises a local oscillator having first and second delay cells and outputting said in-phase local oscillating signal and said quadrature-phase local oscillating signal; and a correction circuit for controlling phase matching characteristics, said correction circuit setting bias current flowing in said first and second delay cells of said local oscillator as being to be different. In another embodiment, the phase matching characteristic is controlled by setting the bias voltage applied to the first and second delay cells as being to be different, by setting the width of the active device included in the first and second delay cells dells as being to be different, or by setting impedance of passive device to be different.

15 Claims, 8 Drawing Sheets

(Prior Art)

LOCAL OSCILLATOR USING I/Q MISMATCH COMPENSATING CIRCUIT THROUGH LO PATH RECEIVER USING THEREOF

FIELD OF INVENTION

The present invention relates to a communication system. Specifically, the invention is directed to a circuit for compensating phase mismatch generated between in-phase signal and quadrature-phase signal of a receiver.

BACKGROUND OF INVENTION

Figure 1:
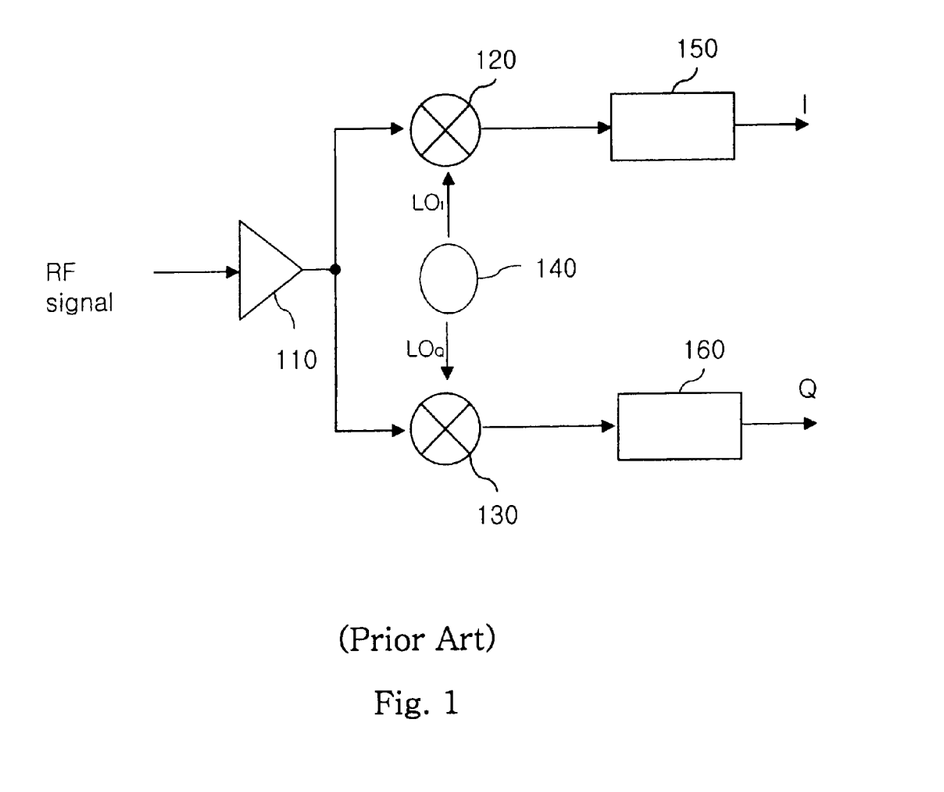
FIG. 1 shows a schematic circuit diagram of the conventional radio frequency receiver.

FIG. 1 shows a schematic circuit diagram of the conventional radio frequency receiver.

As shown in FIG. 1, the conventional radio frequency receiver comprises a low-noise amplifier 110, first and second mixers 120, 130, a local oscillator 140 and first and second base-band circuits 150, 160.

Low-noise amplifier 110 amplifies radio frequency signal received by an antenna to apply the signal to first and second mixers 120, 130. First and second mixers 120, 130 mix the amplified radio frequency signal with in-phase local oscillating signal $LO_I$ and quadrature-phase local oscillating signal $LO_Q$ to output intermediate frequency or base band signal, respectively. First and second base-band circuits 150, 160 amplify/filter the signal outputted from first and second mixers 120, 130, respectively to output in-phase signal I and quadrature-phase signal Q.

In radio communication system, radio frequency receiver transmits data by carrying it in in-phase channel and quadrature-phase channel. Thus, in order to restore signal completely, in-phase local oscillating signal $LO_I$ and quadrature-phase local oscillating signal $LO_Q$ are necessary. If the difference between the phases of $LO_I$ and $LO_Q$ does not equal 90 degree, bit error rate increases in the restored signal. In particular, tile mismatch between in-phase signal I and quadrature-signal Q causes significant problem in the system of direct-conversion receiver and image-removing receiver.

However, the characteristic of delay cells of the local oscillator does not ideally match due to thickness of insulator, device size, space difference, various crystal structure of semiconductor material, mismatch of layout and the like. Such a mismatch of delay cells causes mismatch between in-phase local oscillating signal $LO_I$ and quadrature-phase signal $LO_Q$ outputted from the local oscillator. This is an important cause of generating mismatch between I/Q signals of the receiver. Further, mismatch between devices in way of I and Q path of the receiver is one of causes generating I/Q mismatch of radio frequency receiver.

As clearly understood from a person skilled in the art, size mismatch between in-phase signal I and quadrature-phase signal Q is not significant cause. However, phase mismatch may cause significant problem due to path difference between two signals and device characteristic as frequency increase.

In conventional art, the phase mismatch is corrected with compensation of in-phase signal I and quadrature-phase signal Q of base band that pass a mixer or with compensation of the paths of radio frequency signals I and Q. However, these corrections require additional correction circuit in signal path. The addition of correction circuit to a path where signal passes may degrade gain, noise, linearity and the like. Further, it is difficult to apply the technique in already-manufactured circuit,

SUMMARY OF INVENTION

The object of the present invention is to provide a circuit for correcting phase mismatch between in-phase signal and quadrature-phase signal in a receiver.

Another object of the present invention is to provide a circuit for correcting phase mismatch between in-phase local oscillating signal and quadrature-phase signal outputted from a local oscillator.

Still other object of the present invention is to provide a circuit for correcting phase mismatch between in-phase signal and quadrature-phase signal without substantially affecting gain, noise and linearity and the like of overall system.

Still further object of the present invention is to provide a circuit for correcting in-phase signal and quadrature-phase signal that can be easily applied to already-manufactured circuit.

The local oscillator of the present invention provides in-phase local oscillating signal and quadrature-phase signal to first and second mixers outputting input signal with mixing in-phase local oscillating signal and quadrature-phase local oscillating signal, respectively. The local oscillator comprises a local oscillating unit which has first and second delay cells and which outputs the in-phase local oscillating signal and the quadrature-phase local oscillating signal, and a correction circuit for controlling phase matching characteristic between the in-phase local oscillating signal and the quadrature-phase local oscillating signal outputted from the local oscillating unit. The correction circuit sets bias current flowing in the first and second delay cells of the local oscillating unit as being different.

The first delay cell of the local oscillating unit may have + and − input nodes, + and − output nodes and a correction node. The cell converts phase of signal applied to the + and − input nodes and outputs it to the − and + output nodes. The second delay cell of the local oscillating unit has + and − input nodes which connect with the − and + output nodes of the first delay cell, − and + output nodes which connect with the + and − input nodes of he first delay cell and the correction node. File cell converts phase of signal applied to the + and − input nodes and outputs it to the − and +output nodes. Further, bias current flowing in the first and second delay cells is controlled by current flowing in the correction node.

The correction circuit may comprise first and second varying-current sources. The first and second varying-current sources are connected between the correction node of the first and second delay cells and first power.

In second aspect of the invention, a local oscillator comprises a local oscillating unit which has first and second delay cells and outputs in-phase local oscillating signal and quadrature-phase local oscillating signal, and a correction circuit for correcting phase matching characteristic between the in-phase local oscillating signal and the quadrature-phase local oscillating signal outputted from the local oscillator. The correction circuit sets bias voltage applied to first and second delay cells as being different.

In third aspect of the invention, a local oscillator comprises a local oscillating unit which has first, second and third terminals, first and second delay cells comprising active devices controlling current flowing to the third terminal from the second terminal in proportion to voltage applied to the first terminal, and a correction circuit which has first, second and third terminals connecting with the first, second and third terminals of the active device, respectively and which controls phase matching characteristic between the in-phase local oscillating signal and the quadrature-phase local, signal outputted from the local oscillating unit by setting width of active device included in the first and second delay cells as being different. The oscillating unit outputs the in-phase local oscillating signal and the quadrature-phase local signal.

The correction circuit may have first, second and third terminals, one or more active devices and switching means. The active device controls current flowing to the third terminal from the second terminal in proportion to voltage applied to the first terminal. The first terminal of the active device forms the first terminal of the correction circuit. The second terminal forms the second terminal of the correction circuit. The third terminal of the active device is connected with one end of the switching means and the other end of the switching means forms the third terminal of the correction circuit.

The active device may be nMOSFET device; the first terminal may be a gate and; second terminal may be a drain; and (he third terminal is a source.

The active device may be pMOSFET device; the first terminal may be a gate; the second terminal may be a source; and said third terminal may be a drain.

In forth aspect of the invention, a local oscillator comprises a local oscillating unit which comprises first and second delay cells comprising passive device having specific impedance and which outputs the in-phase local oscillating signal and the quadrature-phase local oscillating signal; and a correction circuit having first and second terminals connecting with one end and the other end of the passive device and for controlling phase matching characteristics between the in-phase local oscillating signal and the quadrature-phase local oscillating signal which are outputted from the local oscillator by making impedance of the passive device included the first and second delay cells as being different.

The correction circuit may comprise a passive device and switching means having specific impedance. One end of the passive device may be connected with the first terminal of the correction circuit. The other end is connected with the one end of the switching means, and the other end of the switching means are connected with the second terminal of the correction circuit.

The passive device may be an inductor.

The passive device may be a capacitor.

A receiver of the present invention comprises a local oscillator having first and second delay cell and outputting in-phase local oscillating signal and quadrature-phase local oscillating signal; first and second mixers which mix input signal with the in-phase local oscillating signal and the quadrature-phase signal, respectively and output the mixed signal; and a correction circuit for controlling phase matching characteristic between the in-phase local oscillating signal and the quadrature-phase local oscillating signal outputted from the local oscillator. The correction circuit sets bias voltage applied to first and second delay cells as being different.

In second aspect of the invention, a receiver comprises a local oscillator having first and second delay cell and outputting in-phase local oscillating signal and quadrature-phase local oscillating signal; first and second mixers which mix input signal with the in-phase local oscillating signal and the quadrature-phase signal respectively and output the mixed signal; and a correction circuit for controlling phase matching characteristic between the in-phase local oscillating signal and the quadrature-phase local oscillating signal outputted lions the local oscillator. The correction circuit sets bias voltage applied to first and second delay cells ass being different.

In third aspect of the present invention a receiver comprises a local oscillator having first, second and third terminals, first and second delay cells comprising active devices controlling current flowing to the third terminal from the second terminal in proportion to voltage applied to the first terminal; first and second mixers which mix input signal with the in-phase local oscillating signal and the quadrature-phase signal, respectively and output the mixed signal: and a correction circuit having first, second and third terminals connecting with the first, second and third terminals of the active device, respectively and for correcting phase matching characteristic between signals outputted from the first and second mixers by setting width of active device included in the first and second delay cells as being different.

The oscillator outputs the in-phase local oscillating signal and the quadrature-phase local signal;

In third aspect of the invention, a receiver comprises a local oscillator which comprises first and second delay cells comprising passive device having specific impedance and outputs the in-phase local oscillating signal and the quadrature-phase local oscillating signal; first and second mixers which mix input signal with the in-phase local oscillating signal and the quadrature-phase signal respectively and output the mixed signal; and a correction circuit having first and second terminals connecting with one end and the other end of the passive device and controlling phase matching characteristics between the in-phase local oscillating signal and the quadrature-phase local oscillating signal being outputted from the local oscillator by making impedance of the passive device included the first and second delay cells as being different.

DISCLOSURE OF PREFERRED EMBODIMENT

In the following, the preferred embodiment of the present invention will be described in detail with reference to attached drawings.

Figure 2:
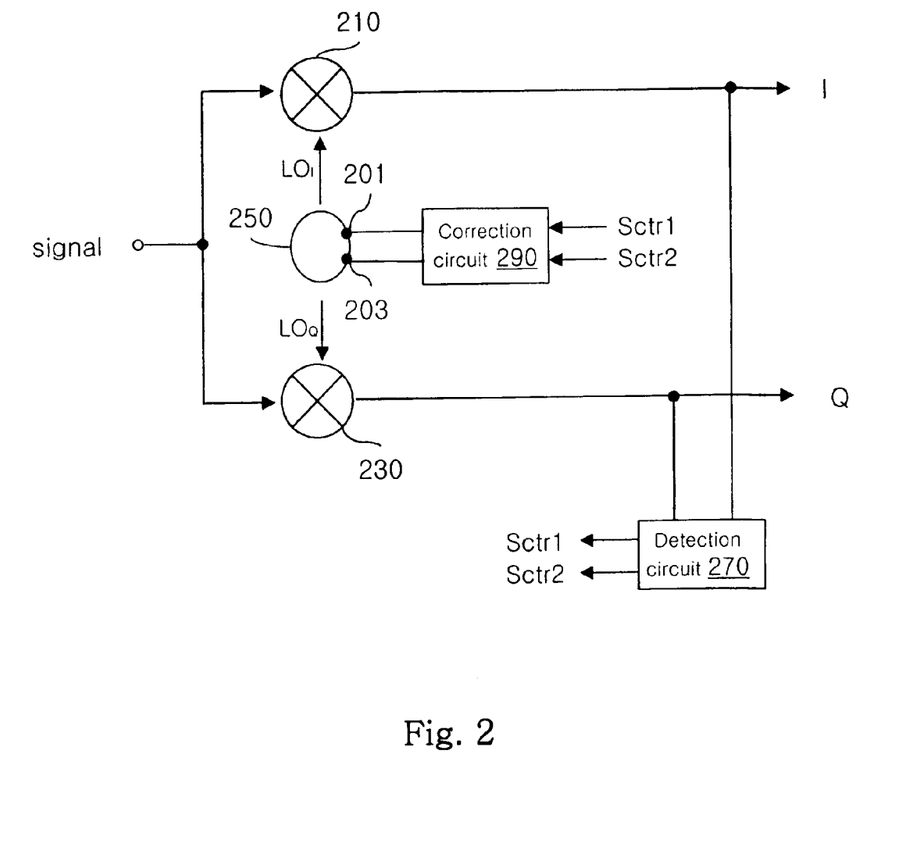
FIG. 2 shows a circuit diagram according to an embodiment of the present invention.

FIG. 2 shows a circuit diagram of an embodiment of the present invention.

As shown in FIG. 2, the receiver comprises first and second mixers 210, 230, local oscillator 250, detection circuit 270, correction circuit 290.

First and second mixers 210, 230 mix in-phase signal $LO_I$ and quadrature-phase signal $LO_Q$ with input signal, respectively, to output base band or intermediate frequency (IF) signal.

Local oscillator 250 has first and second correction nodes 201, 203 and outputs in-phase local oscillating signal $LO_I$ and quadrature-phase signal $LO_Q$ which have the same amplitude. The phases of the signals substantially differs each other by 90 degrees. Matching characteristic of in-phase local oscillating signal LOI and quadrature-phase signal LOQ are controlled by correction signal applied to first and second correction nodes 201, 203.

As described in the below local oscillator 250 of the embodiment of the present invention comprises two or more delay cells and controls phase matching characteristic between output local oscillating signals with inducing mismatch between delay cells. That is, phase mismatch between in-phase local oscillating signal $LO_I$ and quadrature-phase local oscillating signal $LO_Q$ is controlled by generating inverse mismatch that cancels phase-mismatch between local oscillating signals. In one embodiment of the present invention, local oscillator 250 is quadrature-voltage control oscillator.

Detection circuit 270 detects mismatch between in-phase signal I and quadrature-phase signal Q that are outputted from first and second mixers 210, 230, respectively, and outputs first and second control signals Sctr1 and Sctr2. In an embodiment of the present invention, detection circuit 270 can be carried out with conventional circuits or devices. For example, an oscilloscope can detect phase-mismatch between in-phase signal and quadrature-phase signal outputted from first and second mixers 210, 230. Further, detection circuit 270 detects I/Q matching characteristic of initial receiver and outputs control signal and may be removed from real receiver. In this case, initially set control signal can be applied to correction circuit continuously.

Correction circuit 290 outputs correction signal to first and second correction nodes 201, 203 of local oscillator 250 by first and second control signal Sctr1, Sctr2 that are outputted from detection circuit 270. Although in FIG, 2 correction circuit 290 is shown as being separate from local oscillator 250, correction circuit 290 may be installed within local oscillator 950. In this constitution, the local oscillator comprises local oscillating part 250 and correction circuit 290.

Various embodiments of I/Q mismatch correction circuit of receiver through LO path will be described in detail. The spirit of the present invention can be applied to all concepts of correcting I/Q mismatch of receiver through LO path without limiting to the specific embodiment Embodiment of Correcting Mismatch with Control of Bias Current Providing to Delay Cell FIG. 3 shows a detailed circuit diagram of local oscillator 250 and correction circuit 290 of FIG. 2.

Figure 3:
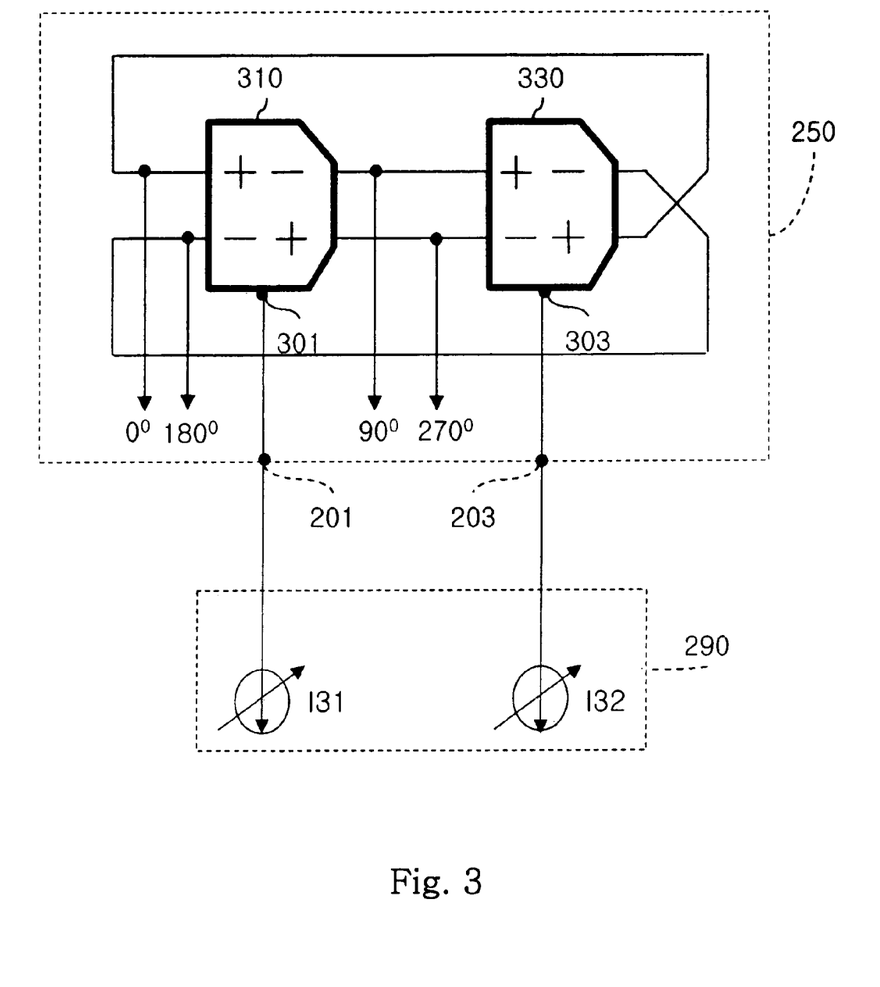
FIG. 3 shows a detailed circuit diagram of a local oscillator and a correction circuit of the circuit shown in FIG. 2.

As shown in FIG. 3, local oscillator 250 comprises first and second delay cells 310, 330 and correction circuit 290 comprises first and second varying-current sources I31, I32. As clearly understood from a person skilled in the art, the number of the delay cells of local oscillator 250 and the number of varying-current source of correction circuit 290 do not limit the scope of the present invention.

In the following, the constitution and connection relationship between the components will be described with reference to FIG. 3.

First delay cell 310 of local oscillator 250 has + and − input nodes, + and − output nodes and correction node 301 and converts signal phase applied to + and − input nodes to transmit it to − and +output nodes, respectively. Second delay cell 330 of local oscillator 250 has + and − input nodes, + and − output nodes and correction node 303 and converts signal phase applied to + and − input nodes to transmit it to − and + output nodes, respectively.

In the local oscillator, first and second delay cells 310, 330 arc ring-connected each other. That is, − and +output nodes of first delay cell 310 are connected with + and − input nodes of second delay cell 330. Correction nodes 301, 303 of first and second delay cell 310, 330 forms first and second correction nodes 201, 230 of local oscillator 250, respectively.

First and second varying-current sources I31, I32 of correction circuit 290 are connected with, first and second correction nodes 201, 203 of local oscillator 250, respectively and supplies current to first and second correction nodes 201, 202 of local oscillator 250.

In the following, the operation of local oscillator 250 and correction circuit 290.

Local oscillator 250 outputs in-phase local oscillating signal $LO_I$ and quadrature-phase oscillating signal $LO_Q$ with ring-connecting first and second delay cells 310, 330 each other. That is, − and + output nodes of first delay cell 310 output signal having phase of 90 degrees and signal having phase of 270 degrees, respectively. The signals have substantially same amplitude. − and +output nodes of second delay cell 330 output signal having phase of 180 degrees and signal having phase of 0 degree, respectively. The signals have substantially same amplitude. Thus, in-phase local oscillating signal $LO_I$ and quadrature-phase local oscillating signal $LO_Q$ of quadrature-phase local oscillator 250 can be obtained by use of the output signal of + output node of second delay cell 330 and − output node of first delay cell 310 or by use of the output signal of ~ output node of second delay cell 330 and + output node of first delay cell 310.

First and second varying-current sources I31, I32 of correction circuit 290 determine current value by first and second control signal Sctr1, Sctr2 outputted from detection circuit 270 and supply current to correction nodes 301, 303 of first and second delay cell 310, 330. That is, correction circuit 290 of one embodiment of the present invention makes the current value supplied to first and second delay cells 310, 330 different each other, thereby controlling phase-match characteristic between in-phase local oscillating signal and quadrature-phase local oscillating signal outputted from the local oscillator. In other words, the circuit generates inverse-mismatch for canceling phase-mismatch between local oscillating signals through first and second varying-current sources I31, I32, thereby restraining phase-mismatch between local oscillating signals.

In another embodiment of the present invention, the phases of in-phase local oscillating signal $LO_I$ and quadrature-phase local oscillating signal $LO_Q$ can be pre-distorted, by making the current flowing in first and second delay cells 301, 330 of local oscillator 250 different each other by phase-mismatch to be generated between base band in-phase signal I and base band quadrature-phase signal Q. Therefore, the phase-mismatch between in-phase signal I and quadrature-phase signal Q can be corrected. However, amplitude mismatch between, first and second local oscillating signal $LO_I$ and $LO_Q$. The amplitude mismatch doe not affect the receiver substantially.

Figure 4:
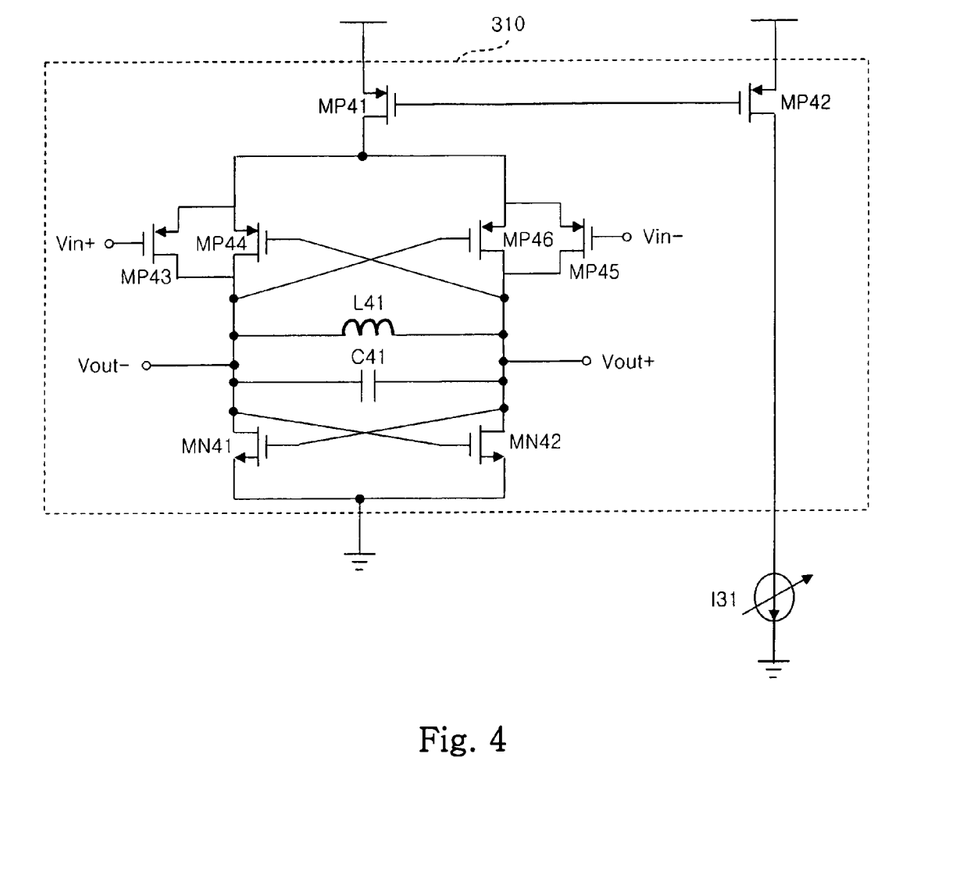
FIG. 4 shows a more detailed circuit diagram of the local oscillator and correction circuit.

FIG. 4 shows a more detailed circuit diagram of local oscillator 250 and correction circuit 290. Since first delay cell 310 and first varying-current source I31 are substantially same as second delay cell 330 and second varying-current source I32, only first delay cell 310 and first bias current I31 are illustrated.

As shown in FIG. 4, first delay cell 310 comprises first to sixth PMOS transistors MP41 to MP46, first and second NMOS transistor MN41, MN42, inductor L41 and capacitor C41.

In the following, local oscillator 250 and correction circuit 290 are described in detail with reference to FIG. 4. However, the constitution and operation of components that are away from the spirit of the present invention will not be described since first delay cell 310 shown in FIG. 4 is well-known and the invention is not limited to a specific embodiment.

First PMOS transistor MP41 of first delay cell 310 is a device of supplying bias current to first delay cell 310 and determines current flowing third to sixth PMOS transistors MP43 to MP46. Gates of first and second NMOS transistors MN41, MN42 are cross-coupled each other to connected to corresponding drain. The sources are sounded to form −gm of first delay cell 310.

The source of second PMOS transistor MP42 is connected to power and its gate is connected to the gate of first PMOS transistor MP41. Thus drain of first PMOS transistor MP41 flows the current which is same as the current flowing the drain of second PMOS transistor MN42.

Inductor L41 and capacitor C41 resonate each other to let local oscillator 250 oscillate desired resonant frequency.

First varying-current source I31 of correction circuit 20 supplies current to the drain of second PMOS transistor MP42 and determines the supplied current amount with first control signal Sctr1. Thus, the drain of first PMOS transistor MP41 flows current which is substantially same as the current supplied to first varying-current source I31. Thus, the current flowing in delay cell 310 can be controlled by varying current of first varying current source I31.

The receiver in accordance with an embodiment of the present invention corrects phase-mismatch between local oscillating signals applied to first and second mixers 210, 230 respectively, by making the bias current flowing in first and second delay cells 310,330 different each other. That is, since I/Q signal mismatch of the receiver is corrected with LO path, gain, noise and linearity of overall system is not substantially affected.

Further, detection circuit 270 may be mounted outside radio frequency receiver circuit. In this constitution, first and second bias current I31, I32 of correction circuit 290 can be controlled outside. Thus, it is not necessary to provide additional circuit within a correction circuit, thereby making it easy to apply to already-manufactured circuit.

Figure 5:
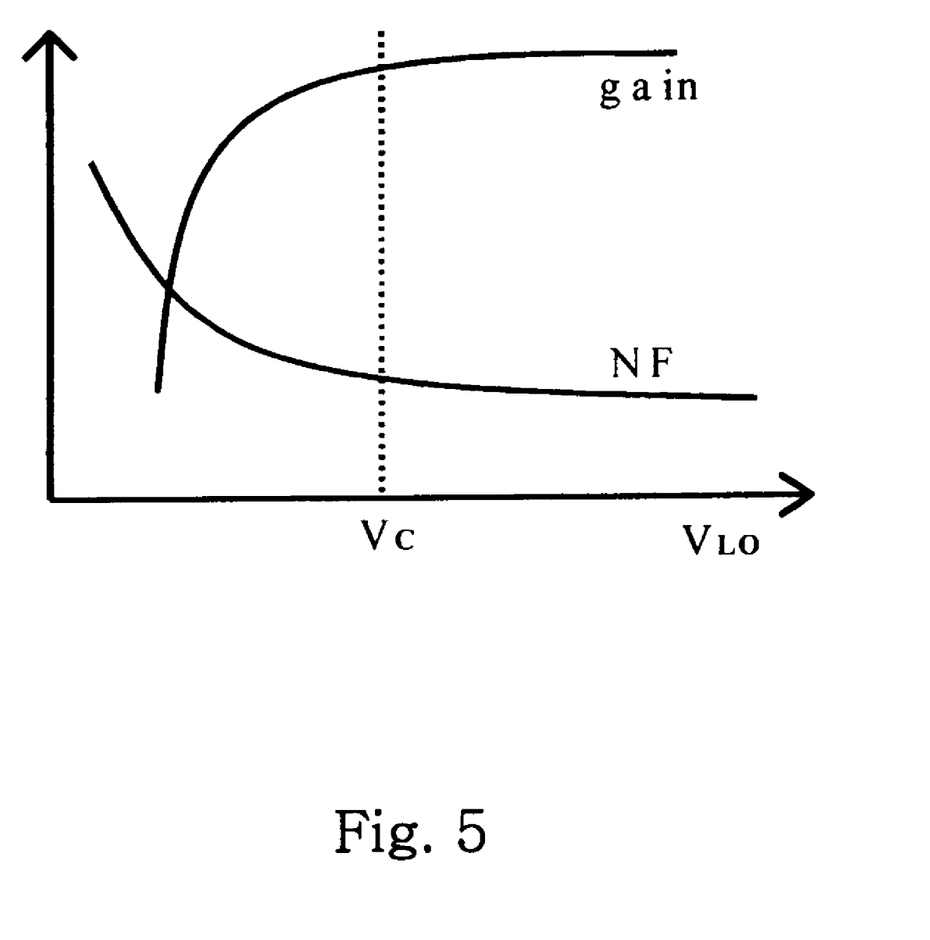
FIG. 5 shows a waveform of mixer gain and noise characteristics according to a local oscillating signal.

FIG. 5 shows a waveform of mixer gain and noise characteristic according to local oscillating signal.

As shown in FIG. 5 mixer gain and noise characteristic do vary hardly if the amplitude of local oscillating signal is not less than a predetermined level. Further, since the local oscillating signal of radio frequency receiver uses signal not lets than Vc shown in FIG. 5 generally, amplitude mismatch generated in the local oscillating signal hardly affect mixer gain or noise characteristic. Thus, the amplitude mismatch generated by flowing bias current different each other in first and second delay cell 310, 330, does not affect to a system substantially.

Figure 6:
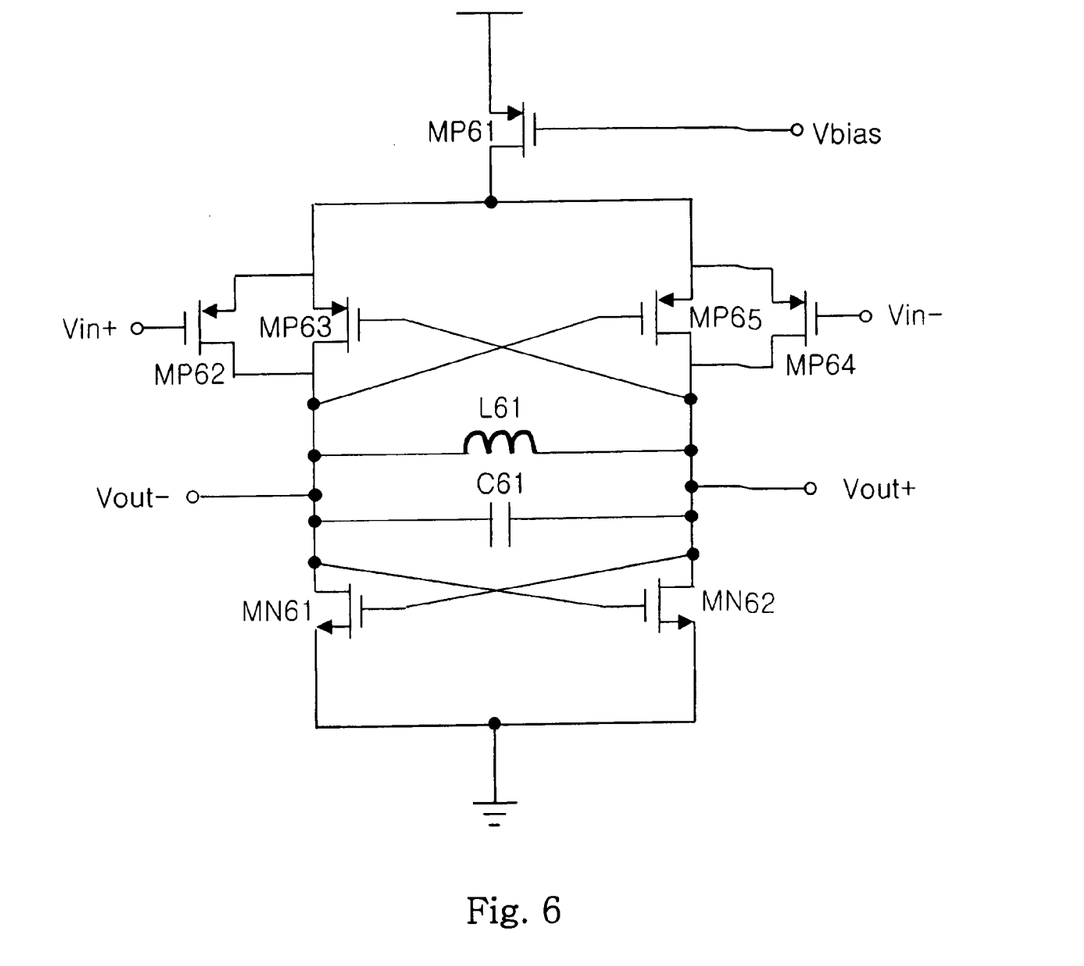
FIG. 6 shows a circuit diagram of a delay cell and correction circuit according to another embodiment of the present invention.

Embodiment of Correcting Mismatch by Controlling Bias Voltage Supplying to Delay Cell FIG. 6 shows a circuit diagram of delay cell and correction circuit of another embodiment of the present invention.

As shown in FIG. 6, the correction circuit of the embodiment differs from the correction circuit shown in FIGS. 3 and 4 in that it controls output signal phase by setting bias voltage applied to each delay cell of local oscillator differently.

The correction circuit controls current flowing in the drain of first PMOS transistor MP61 by controlling voltage applied to first PMOS transistor MP61. That is, the current flowing in each delay cell can be controlled by setting bias voltage of first and second delay cells 310, 330 differently. Further, the phase mismatch between in-phase local oscillating signal and quadrature-phase signal that are outputted from local oscillator 250 can be corrected by the setting.

Figure 7A:
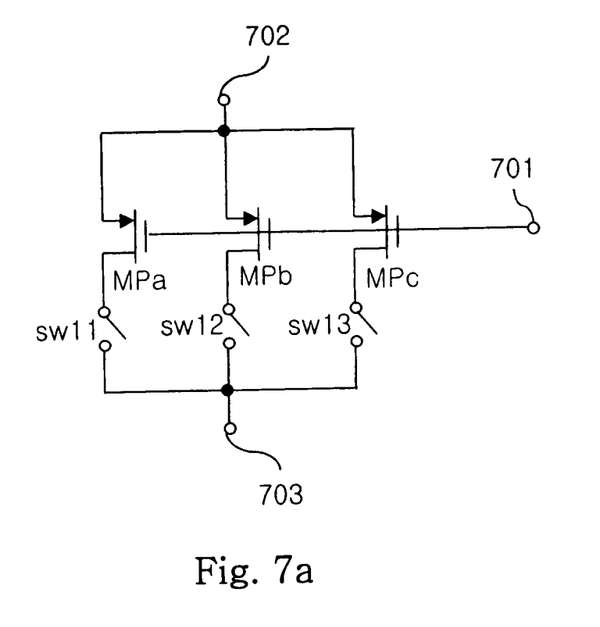
FIG. 7a is a view of a correction circuit for controlling the width of a PMOS transistor.
Figure 7B:
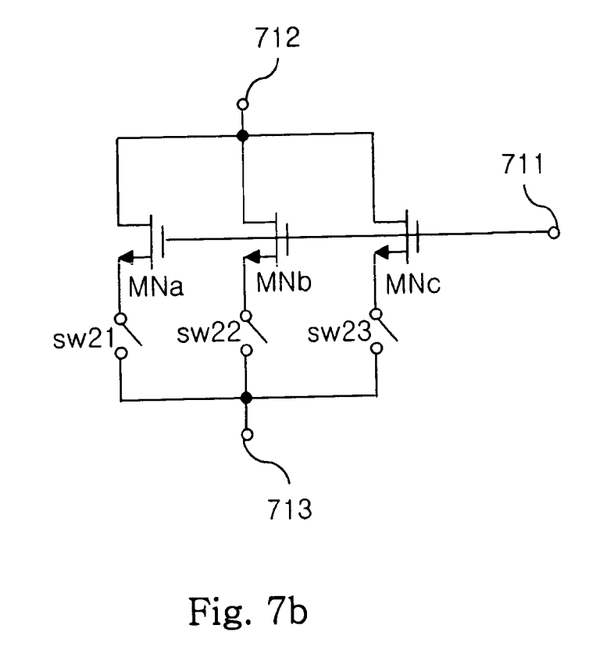
FIG. 7b is a view of a correction circuit for controlling width of an NMOS transistor.

Embodiment of Correcting Mismatch by Controlling Width of Active Device of Delay Cell FIGS. 7a and 7b show a circuit diagram of the correction circuit of still other embodiment of the present invention.

FIG. 7a is a correction circuit for controlling width of PMOS transistor and FIG. 7b is a correction circuit for controlling width of NMOS transistor.

Generally, in a delay cell using active devices, the active devices are connected parallel. That is, the actual width of the active devices varies in accordance with the number of parallel-connected active devices. Thus, mismatch between output signals of first and second delay cells 310, 330 can be induced by setting on-off each switching means of the active devices differently.

In the following, the constitution and operation of the correction circuit of FIGS. 7a and 7b are described in detail.

FIG. 7a is for controlling the width of PMOS transistor of first and second delay cell 310, 330 and includes one or more PMOS transistor MPa and switching means SW11.

The gates of PMOS transistors MPa, MPb, MPc of the correction circuit are connected one another to form first terminal 701. The sources of the transistors are connected to one another to form second terminal 702. Further, the drains of PMOS transistor MPa, MPb, MPc are connected to one end of first to third switching means SW11, SW12, SW13. The other end of first to third switching means SW11, SW12. SW13 are connected to one another to form third terminal 703 of the correction circuit.

FIG. 7b is for controlling the width of NMOS transistor of first and second delay cell 310, 330 and comprises one or more NMOS transistor MNa and switching means SW21.

The gates of MNa, Mnb, MNc of each NMOS transistor of the correction circuit are connected one another to form first terminal 711 of the correction circuit. The drains of the transistors are connected one another to form second terminal 712. Further, the sources of each NMOS transistor MNa, MNb, MNc are connected to one end of first to third switching means SW21, SW22, SW23. The other end of first and third switching means SW21, SW22. SW23 are connected to one another to form third terminal 713.

In the receiver of another embodiment of the present invention, mismatch between first and second delay cell 310, 330 can be induced by connecting the correction circuit shown in FIGS. 7a and 7b with one of active devices included in first and second delay cells 310, 330 and thereafter setting on-off of each switching, means differently.

That is, first terminal 701 of the correction circuit shown in FIG. 7a are connected with the gate of one of PMOS transistors included in first and second delay cells 310, 330 and thereafter, the source is connected with second terminal 702 of the correction circuit. Subsequently, the drain is connected with third terminal 703. In the same way, one of NMOS transistors included in first and second delay cell 310, 330 is connected with first, second and third terminals 711, 712, 713 of the correction circuit shown in FIG. 7b.

The correction circuit can be connected with symmetric active device included in first and second delay cell 310, 330. Alternatively, it may be connected with any one of delay cells. Furthers all of P-type correction circuit and N-type correction circuit are connected. In addition, specific correction circuit can be connected with a plurality of symmetric devices.

N-type and/or P-type correction circuit is connected with the symmetric active devices and control signal is applied to the switch included in each correction circuit, thereby controlling the width of each active device. That is, the phase-mismatch between output in-phase local oscillating signal $LO_I$ and quadrature-phase local oscillating signal $LO_Q$ can be corrected by making the width of symmetric active devise included in first and second delay cell 310, 330.

As described in the above, the phase of in-phase local oscillating signal $LO_I$ and quadrature-phase local oscillating signal $LO_Q$ are pre-distorted by making the width of active devices included in first and second delay cells 310, 330 of local oscillator 250 by phase mismatch generated between base band in-phase signal I and base band quadrature-phase signal Q of the receiver different. Thus, the phase mismatch generated between in-phase signal I and quadrature-phase signal Q can be corrected.

Embodiment of Correcting Mismatch by Controlling Impedance of Passive Device Included in Delay Cell, 310, 330

Figure 8A:
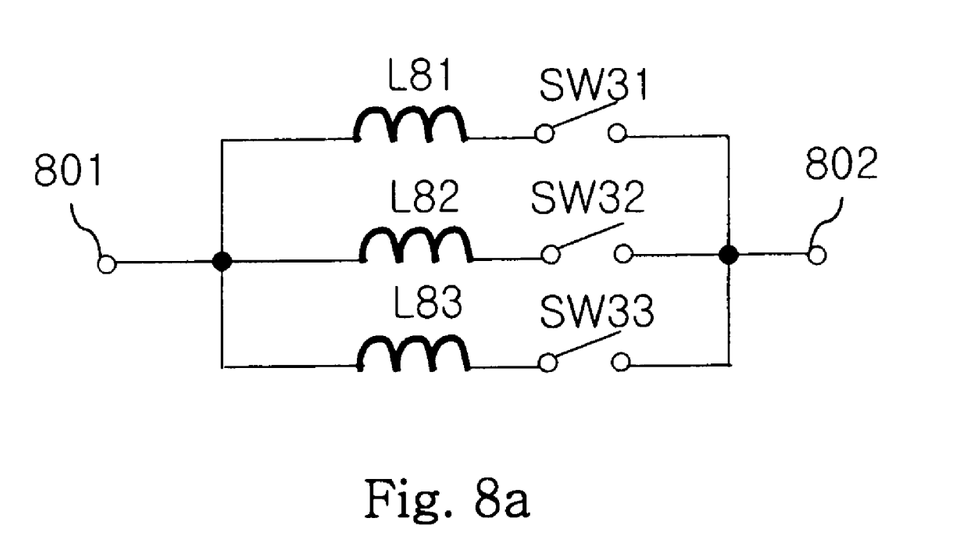
FIG. 8a shows a correction circuit for controlling inductance of an inductor.
Figure 8B:
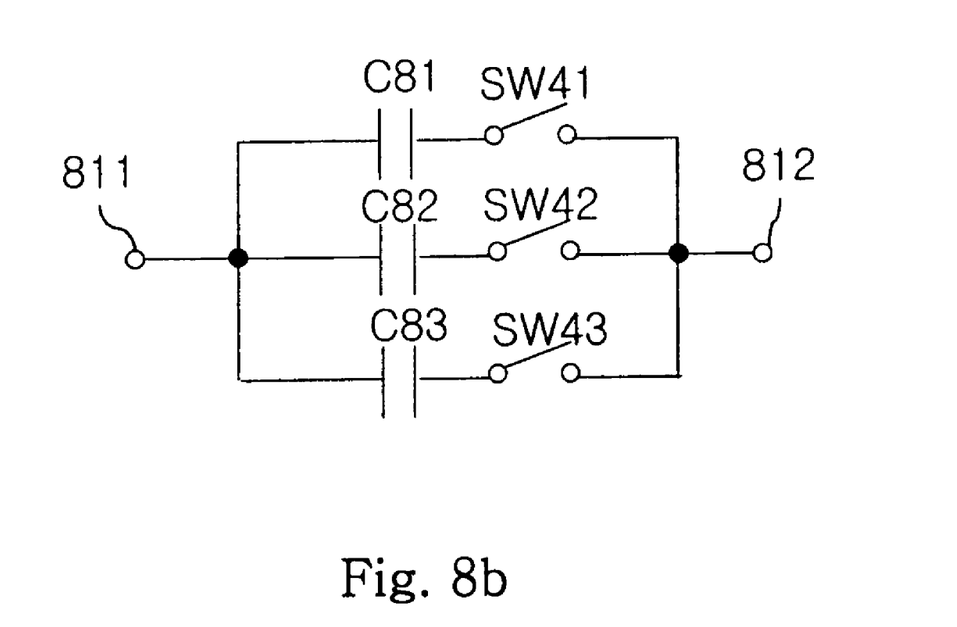
FIG. 8b shows a correction circuit for controlling capacitance of a capacitor.

FIGS. 8a and 8b are circuit diagrams of collection circuits in accordance with another embodiment.

FIG. 8a shows a correction circuit for controlling inductance of inductor included in first and second delay cells 310, 330. FIG. 8b shows a correction circuit for controlling capacitance of capacitor included in first and second delay cell 310, 330.

As described in the above, the inductor and capacitor of first and second delay cells 310, 330 are devices for resonating each other to make local oscillator 250 oscillate in resonant frequency. The correction circuit sets the impedance of the inductor L and capacitor C included in first and second delay cells 310, 330 as being different, thereby correcting the mismatch between in-phase local oscillating signal $LO_I$ and $LO_Q$.

In the following, the constitution and operation of correction circuit of another embodiment will be described in detail with reference to FIGS. 8a and 8b.

The correction circuit shown in FIG. 8a comprises one or more inductor and switching means. One ends of LB1, LB2 and LB3 are connected with one another to form an end 801 of the correction circuit. The other ends are connected with one ends of SW31, SW32 and SW33, respectively. The other ends of switching means SW31, SW32 and SW33 are connected one another to form other ends 802 of correction circuits.

As described in the above, the correction circuit shown in FIG. 8b comprises one or more capacitors and switching means. One ends of CB1, CB2 and CB3 are connected with one another to form an end 811 of the correction circuit. The other ends are connected with one ends of SW41, SW42, and SW43, respectively. The other ends of switching means SW41, SW42 and SW43 are connected one another to form other ends 912 of correction circuits.

The correction circuit shown in FIGS. 8a and 8b are connected with one end or the other ends of inductor or capacitor included in first and second delay cells 310, 330 to control inductance and capacitance of the delay cells. That is, the phase mismatch between in-phase local oscillating signal $LO_I$ and quadrature-phase signal $LO_Q$ is corrected by setting inductance or capacitance of first and second delay cells 310, 330 as being different.

In a correction circuit of still other embodiment, the mismatch of two or more delay cells consisting local oscillator are induced by setting impedance of passive device included in each delay cell as being different. Thus, according to embodiment, the correction circuit shown in FIGS. 8a and 8b can be provided in one delay cell or all delay cells.

According to the present invention the phase matching characteristic between in-phase signal and quadarture-phase signal by correcting the phase mismatch between in-phase local oscillating signal and quadrature-phase signal.

Further, the phase mismatch between base hand in-phase signal and quadrature-phase signal by distorting the phase of in-phase local oscillating signal and quadrature-phase signal by the phase mismatch generated in in-phase signal path and quadrature-phase signal path of a receiver.

In addition, the phase mismatch can be corrected without affecting gain, noise and linearity characteristics by correcting phase mismatch through paths of local, oscillating signal.

In already-manufactured circuits, the phase mismatch between in-phase signal I and quadrature-phase signal Q can be corrected by controlling the corrector circuit connected with the first and second delay cells of the local oscillator outside the manufactured circuits.

What is claimed is:

1. A local oscillator providing an in-phase local oscillating signal and quadrature-phase signal to first and second mixers outputting an input signal with a mixed in-phase local oscillating signal and quadrature-phase local oscillating signal, respectively, comprising:

a local oscillating unit having first and second delay cells and outputting said the in-phase local oscillating signal and the quadrature-phase local oscillating signal; and a correction circuit being configured to control a phase matching characteristic between the in-phase local oscillating signal and the quadrature-phase local oscillating signal outputted from said local oscillator, said correction circuit setting bias current flowing in said first and second delay cells of said local oscillator to be different.

2. The local oscillator of claim 1, wherein said first delay cell of said local oscillating unit has + and − input nodes, + and − output nodes, and a correction node, a cell converting phase of a signal is applied to said + and − input nodes and outputs the signal to said − and + output nodes, said second delay cell of said local oscillating unit has + and − input nodes which connect with said − and + output nodes of said first delay cell, − and + output nodes connecting with said + and − input nodes of said first delay cell, and a correction node, said cell converting phase of the signal is applied to said + and − input nodes of said second delay cell and outputs it to said − and + output node of said second delay cell, and bias current flowing in said first and second delay cell is controlled by current flowing in said correction node.

3. The local oscillator of claim 1, wherein said correction circuit includes first and second varying-current sources, said first and second varying-current sources are connected between said correction nodes of said first and second delay cells and a first power source.

4. A local oscillator providing an in-phase local oscillating signal and a quadrature-phase signal to first and second mixers outputting an input signal with a mixed in-phase local oscillating signal and quadrature-phase local oscillating signal, respectively, comprising:
  a local oscillating unit having first and second delay cells and outputting the in-phase local oscillating signal and the quadrature-phase local oscillating signal; and
  a correction circuit being configured to control a phase matching characteristic between the in-phase local oscillating signal and the quadrature-phase local oscillating signal outputted from said local oscillator, said correction circuit setting bias voltage applied to first and second delay cells to be different.

5. A local oscillator providing in-phase local oscillating signal and a quadrature-phase signal to first and second mixers outputting an input signal with a mixed in-phase local oscillating signal and quadrature-phase local oscillating signal, respectively, comprising:
  a local oscillating unit having first, second, and third terminals, first and second delay cells having active devices controlling current flowing to said third terminal from said second terminal in proportion to applied voltage to said first terminal, said oscillator outputting the in-phase local oscillating signal and the quadrature-phase local signal; and
  a correction circuit having first, second and third terminals connecting with said first, second, and third terminals of said local oscillating unit, respectively and controlling phase matching characteristics between the in-phase local oscillating signal and the quadrature-phase local signal outputted from said local oscillator by setting widths of said active devices included in said first and second delay cells to be different.

6. The local oscillator of claim 5, wherein said correction circuit has first, second, and third terminals, at least one active device and switch, said active device controlling current flowing to said third terminal from said second terminal in proportion to voltage applied to said first terminal, the first terminal of said active device forming said first terminal of said correction circuit, said second terminal forming said second terminal of said correction circuit, said third terminal of said active device being connected to one end of said switch, the other end of said switching means forming said third terminal of said correction circuit.

7. The local oscillator of claim 5 or 6, wherein said active device is nMOSFET device, said first terminal is a gate, said second terminal is a drain, and said third terminal is a source.

8. The local oscillator of claim 5 or 6, wherein said active device is pMOSFET device, said first terminal is a gate, said second terminal is a source, and said third terminal is a drain.

9. A local oscillator providing an in-phase local oscillating signal and a quadrature-phase signal to first and second mixers outputting an input signal with a mixed in-phase local oscillating signal and a quadrature-phase local oscillating signal, respectively, comprising:
  a local oscillating unit having first and second delay cells having a passive device having specific impedance and outputting the in-phase local oscillating signal and the quadrature-phase local oscillating signal; and
  a correction circuit having first and second terminals connecting one end and the other end of said passive device and controlling phase matching characteristics between the in-phase local oscillating signal and the quadrature-phase local oscillating signal being outputted from said local oscillator by making impedance of said passive device including said first and second delay cells different.

10. The local oscillator of claim 9, wherein said correction circuit includes a passive device and a switch having a specific impedance, one end of said passive device being connected with said first terminal of said correction circuit, the other end being connected with one end of said switch, the other end of said switching means being connected with said second terminal of said correction circuit.

11. The local oscillator of claim 9 or 10, wherein said passive device is an inductor.

12. The local oscillator of claim 9 or 10, wherein said passive device is a capacitor.

13. A receiver comprising:
  a local oscillator having first and second delay cells and outputting an in-phase local oscillating signal and a quadrature-phase local oscillating signal;
  first and second mixers mixing an input signal with said in-phase local oscillating signal and said quadrature-phase signal, respectively and outputting a mixed signal; and
  a correction circuit being configured to control phase matching characteristics between said in-phase local oscillating signal and said quadrature-phase local oscillating signal outputted from said local oscillator, said correction circuit setting bias voltage applied to first and second delay cells to be different.

14. A receiver comprising:
  a local oscillator having first, second, and third terminals, first and second delay cells having active devices controlling current flowing to said third terminal from said second terminal in proportion to applied voltage to said first terminal, said local oscillator outputting said in-phase local oscillating signal and said quadrature-phase local signal;
  first and second mixers mixing an input signal with said in-phase local oscillating signal and said quadrature-phase signal, respectively and outputting a mixed signal; and
  a correction circuit having first, second, and third terminals connecting said first, second, and third terminals of said active device, respectively and correcting phase matching characteristics between signals outputted from said first and second mixers by setting a width of an active device included in said first and second delay cells to be different.

15. A receiver comprising:
  a local oscillator having first and second delay cells having a passive device having a specific impedance and outputting an in-phase local oscillating signal and an quadrature-phase local oscillating signal;
  first and second mixers mixing an input signal with said in-phase local oscillating signal and said quadrature-phase signal, respectively and outputting a mixed signal; and
  a correction circuit having first and second terminals connecting with one end and the other end of said passive device and controlling phase matching characteristics between said in-phase local oscillating signal and said quadrature-phase local oscillating signal being outputted from said local oscillator by making impedance of said passive device including said first and second delay cells different.

* * * * *